United States Patent [19]

Wada et al.

[11] Patent Number: 5,169,830
[45] Date of Patent: Dec. 8, 1992

[54] SUPERCONDUCTING MATERIAL

[75] Inventors: Takahiro Wada; Shinichi Koriyama, both of Urayasu; Takeshi Sakurai, Urawa; Nobuo Suzuki, Kunitachi; Takayuki Miyatake, Matsudo; Hisao Yamauchi, Urayasu; Naoki Koshizuka, Ushiku; Shoji Tanaka, Tokyo, all of Japan

[73] Assignees: Internationnal Superconductivity Technology Center; Mitsubushi Metal Corporation; Kyocera Corporation; The Tokyo Electric Power Company, all of Japan

[21] Appl. No.: 567,958

[22] Filed: Aug. 15, 1990

[30] Foreign Application Priority Data

Aug. 18, 1989 [JP] Japan .................................. 1-213728
Oct. 30, 1989 [JP] Japan .................................. 1-282702

[51] Int. Cl.[5] .................. C01F 11/02; H01L 39/12
[52] U.S. Cl. ................................. 505/1; 505/778; 423/593
[58] Field of Search .................. 423/593; 505/778, 1

[56] References Cited

U.S. PATENT DOCUMENTS 4,952,390 8/1990 Takei et al. .................. 423/593

OTHER PUBLICATIONS

Nature, "$T_c$ Increased to 90K in $YBA_2Cu_4O_8$ by Ca Doping"; Sep. 7, 1989; vol. 341, Issue No. 6237; pp. 41-42.
Physical Review, vol. 39, No. 10, 01 Apr. 1989, pp. 7347-7350.
Physica, vol. 159, No. 3, 15 Jun. 1989, pp. 287-294.
Applied Physics Letters, vol. 52, No. 22, 30 May 1988, pp. 1901-1903.

Primary Examiner—Michael Lewis
Assistant Examiner—Stuart L. Hendrickson
Attorney, Agent, or Firm—Lorusso & Loud

[57] ABSTRACT

A superconductive material is disclosed which has the following composition:

$$(R_{1-x}Ca_x)(Ba_{1-y}La_y)_2Cu_4O_8$$

wherein R is at least one element selected from Y, Nd, Sm, Eu, Gd, Dy, Ho, Er, Tm, Yb and Lu, x is a number in the range of 0-0.3 and y is a number in the range of 0.001-0.3 with the proviso that y is not greater than 0.2 when x is not 0.

3 Claims, 15 Drawing Sheets

YBa₂Cu₄O₈

YBa₂Cu₃O₇

SUPERCONDUCTING MATERIAL

BACKGROUND OF THE INVENTION

1. Field of the Invention

This invention relates to a novel superconducting material having an $RBa_2Cu_4O_8$ (R=a rare earth element) crystallographic phase.

2. Description of the Prior Art

A superconducting material having a composition $RBa_2Cu_3O_7$ (R=a rare earth element) is known to have a high superconducting transition temperature Tc higher than the boiling point (77K) of liquid nitrogen (Appl. Phys. Lett. 51, 57(1987)). The oxygen content of this material varies according to conditions such as, temperature and oxygen partial pressure, under which the material has been sintered, so that the crystal phase thereof shifts between the tetragonal and orthorhombic systems. As a consequence of this phase change, Tc of the superconducting material considerably varies in the range of from 90K to 0K (insulation). Thus, it would be possible to control the Tc of the superconducting material to a desired point by controlling the oxygen content thereof. However, the superconducting material with a controlled Tc cannot be suitably used for the preparation of superconductor articles. Namely, when such a superconducting material is used as a raw material for the preparation of, for example, a wiring rod by a silver-sheathed wiring method in which a silver pipe filled with powder of the superconducting material is subjected to cold drawing, followed by sintering at 800°-900° C., the superconductivity deteriorates due to loss of its oxygen during the sintering stage. It is, therefore, extremely difficult to obtain a superconductor having a desired Tc using $RBa_2Cu_3O_7$.

There is proposed a high Tc superconducting material composed of $RBa_2Cu_4O_8$ (R=Y, Nd, Sm, Eu, Gd, Dy, Ho, Er, Tm) and having a three-layered pervoskite crystal structure with double CuO one-dimensional chains (Phys. Rev. B. 39, 7347(1989)). This material does not encounter increase or decrease in its oxygen content at temperatures up to about 850° C. and, thus, is stable in such an environment. However, no means have been proposed for controlling Tc to a desired point. Another problem of this superconducting material is raised when used in actual industrial applications and relates to the fact that it is necessary to use, as a raw material for the production thereof, $Ba(NO_3)_2$ which is expensive and poisonous.

SUMMARY OF THE INVENTION

It is, therefore, an object of the present invention to provide novel, stable superconducting materials having superconducting transition temperatures Tc controlled in a wide range.

Another object of the present invention is to provide a superconducting material having Tc higher than the boiling point of liquid nitrogen, especially higher than about 80K.

It is a further object of the present invention to provide a novel superconducting material having a $YBa_2Cu_4O_8$ crystallographic phase.

It is yet a further object of the present invention to provide a superconducting material of the above-mentioned type which has a reduced content of Ba.

It is yet a further object of the present invention to provide a superconducting material of the above-mentioned type which permits the use of relatively inexpensive $BaCO_3$ as a raw material for the production thereof.

In accomplishing the foregoing objects, there is provided in accordance with the present invention a superconductive material having the following composition:

$$(R_{1-x}Ca_x)(Ba_{1-y}La_y)_2Cu_4O_8$$

wherein R is at least one element selected from the group consisting of for Y, Nd, Sm, Eu, Gd, Dy, Ho, Er, Tm, Yb and Lu, x is a number in the range of 0-0.3 and y is a number in the range of 0.001-0.3 with the proviso that y is not greater than 0.2 when x is not 0.

BRIEF DESCRIPTION OF THE DRAWINGS

Other objects, features and advantages of the present invention will become apparent from the detailed description of the invention which follows, when considered in light of the accompanying drawings, in which.

DETAILED DESCRIPTION OF THE INVENTION

The oxide superconductor according to the present invention has a composition expressed by the following formula (I):

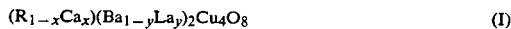

$$(R_{1-x}Ca_x)(Ba_{1-y}La_y)_2Cu_4O_8 \qquad (I)$$

wherein R is at least one element selected from the group consisting of for Y, Nd, Sm, Eu, Gd, Dy, Ho, Er, Tm, Yb and Lu, x is a number in the range of 0–0.3 and y is a number in the range of 0.001–0.3 with the proviso that y is not greater than 0.2 when x is not 0.

When x is 0 in the above formula (I), the composition is expressed by the following formula (II):

$$R(Ba_{1-y}La_y)_2Cu_4O_8 \qquad (II)$$

Figure 1:
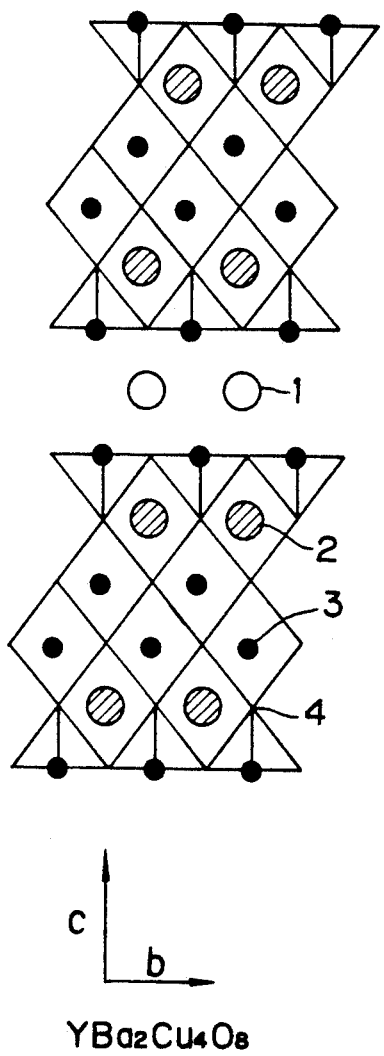
FIG. 1 is a schematic illustration of the crystal structure of $RBa_2Cu_4O_8$ which is the main component of the superconducting material of the present invention.
Figure 2:
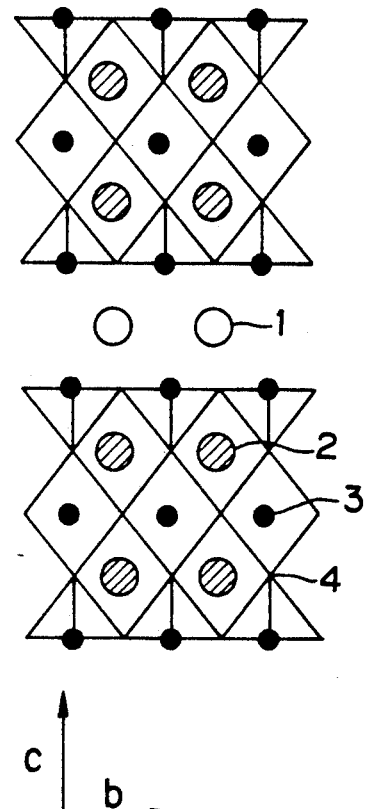
FIG. 2 is a schematic illustration of the crystal structure of $RBa_2Cu_3O_7$.

In this case, y is 0.001–0.3. This composition is that obtained by substituting La for a portion of Ba of $RBa_2Cu_4O_8$. FIG. 1 illustrates the basic structure of $RBa_2Cu_4O_8$ which is the main component of the superconducting material of the present invention. For the comparison purpose, the crystal structure of $RBa_2Cu_3O_7$ is shown in FIG. 2. In these Figures, the reference numeral 1 designates a rare earth element R, 2 designates Ba, 3 designates Cu and 4 designates O positioned in the intersections. The superconducting material of the formula (II) has a crystal structure in which the single CuO chain of the structure shown in FIG. 2 is substituted by a double CuO chain as shown in FIG. 1 and in which a portion of Ba in FIG. 1 is replaced by La.

The superconducting transition temperature Tc of the material of the formula (II) varies with the amount of La. Thus, by controlling the amount of La substituted for Ba, Tc may be controlled at will. Further, this material is stable at temperatures up to about 850° C. Moreover, the substitution of La for Ba has a merit that the amount of the poisonous Ba raw material compound may be decreased. The superconducting material of the formula (II) is, therefore, well suited for actual industrial applications such as in formation of highly condensed wiring rods by the previously described silver-sheathed wiring method.

When x is not 0 in the composition of the formula (I), y is in the range of 0.001–0.2. In this case, x is preferably in the range of 0.001–0.3 and R is preferably selected from Y, Nd, Sm, Eu, Gd, Dy, Ho, Er, Tm and mixtures thereof.

The superconducting material of the formula (I) in which x is not 0 has a crystal structure in which a portion of each of R and Ba in FIG. 1 is replaced by Ca and La, respectively. This superconducting material generally has Tc of higher than 80K. Additionally, the material is stable at temperatures up to around 850° C. and advantageously contains a reduced amount of Ba. Further, the material allows the use of inexpensive $BaCO_3$ as a raw material for the preparation thereof. The thermal stability of the superconducting material also permits the use of a binder for forming a high density shaped article, because the binder may be completely removed during heat treatment at a high temperature of up to about 850° C. This is advantageous because such an increase of density can improve the superconducting current density.

Because of these advantages, the superconducting material according to the present invention is suitably used on an industrial scale for the production of various superconductors and other applications such as wirings for low temperature electrical instruments and magnetic shielding materials.

The following examples will further illustrate the present invention.

EXAMPLE 1

Metal oxide compositions having the formula $Y(Ba_{1-y}La_y)_2Cu_4O_8$ wherein y=0, 0.01, 0.05, 0.1, 0.2, 0.3 and 0.4 were prepared. Thus, quantities of $Y_2O_3$ powder, $Ba(NO_3)_2$ powder, CuO powder and $La_2O_3$ were mixed and the mixture was calcined at 850° C. in an oxygen atmosphere for 24 hours. The calcined mass was ground and formed into a rectangular block, followed by heating at 800° C. in an oxygen atomosphere for 5 hours. The resulting pre-sintered sample was then heat-treated in an mixed gas atmosphere of 80% argon and 20% oxygen at a pressure of 1,000 kg/cm². The heat treatment was performed by first heating the sample to 960° C. with a heating rate of 200° C./hour, then maintaining at 960° C. for 6 hours, increasing the temperature to 1,050° C. with a heating rate of 200° C./hour and finally maintaining at 1,050° C. for 6 hours. Thereafter, the sample was cooled to 300° C. with a cooling rate of 200° C./hour. The pressure was then released and the treated sample was allowed to stand in air, ground, shaped and sintered again at 800° C. in an oxygen atmosphere to obtain a sintered product.

Figure 3:
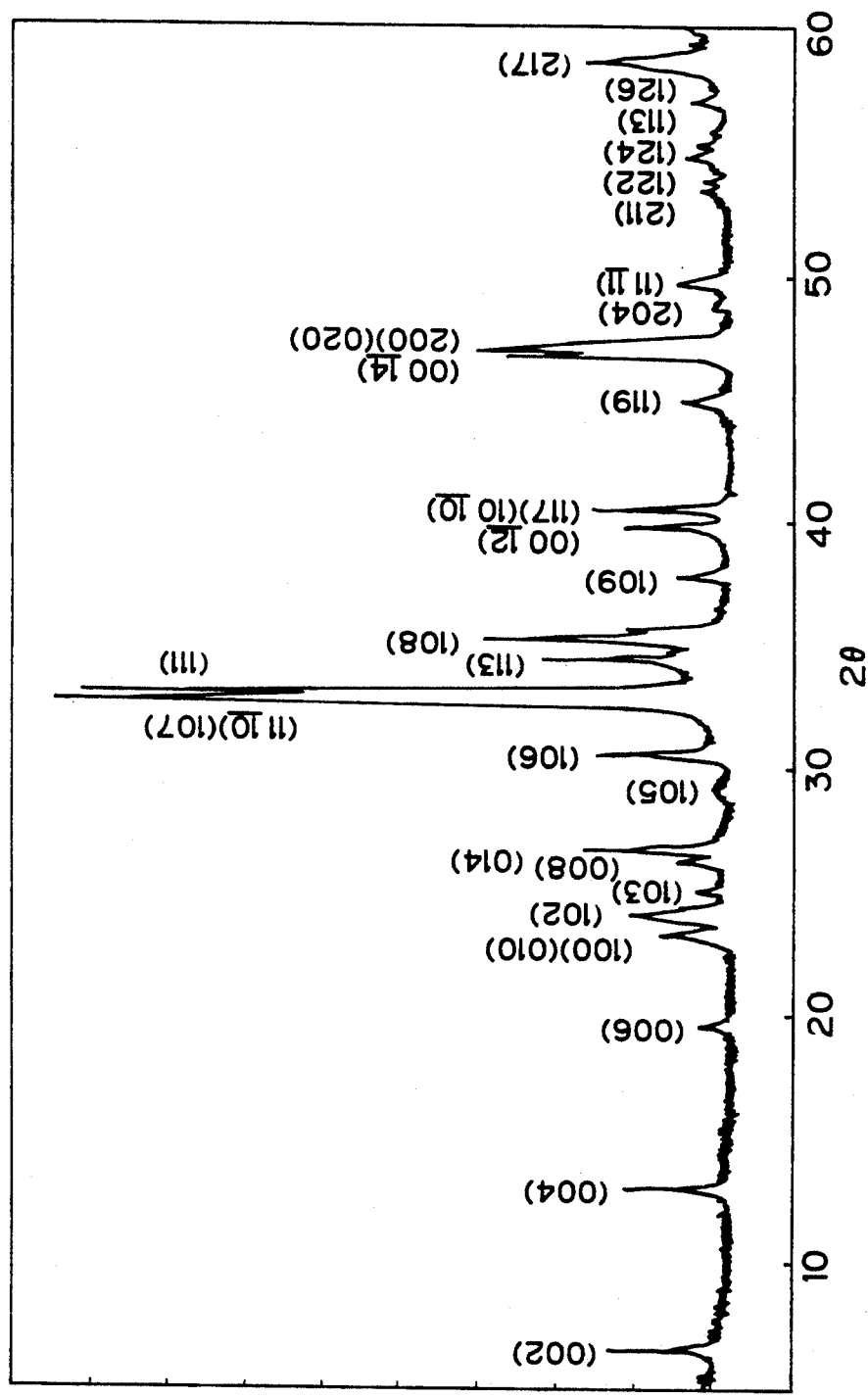
FIG. 3 is a powder X-ray diffraction pattern of $Y(Ba_{0.9}La_{0.1})_2Cu_4O_8$ obtained in Example 1.
Figure 4:
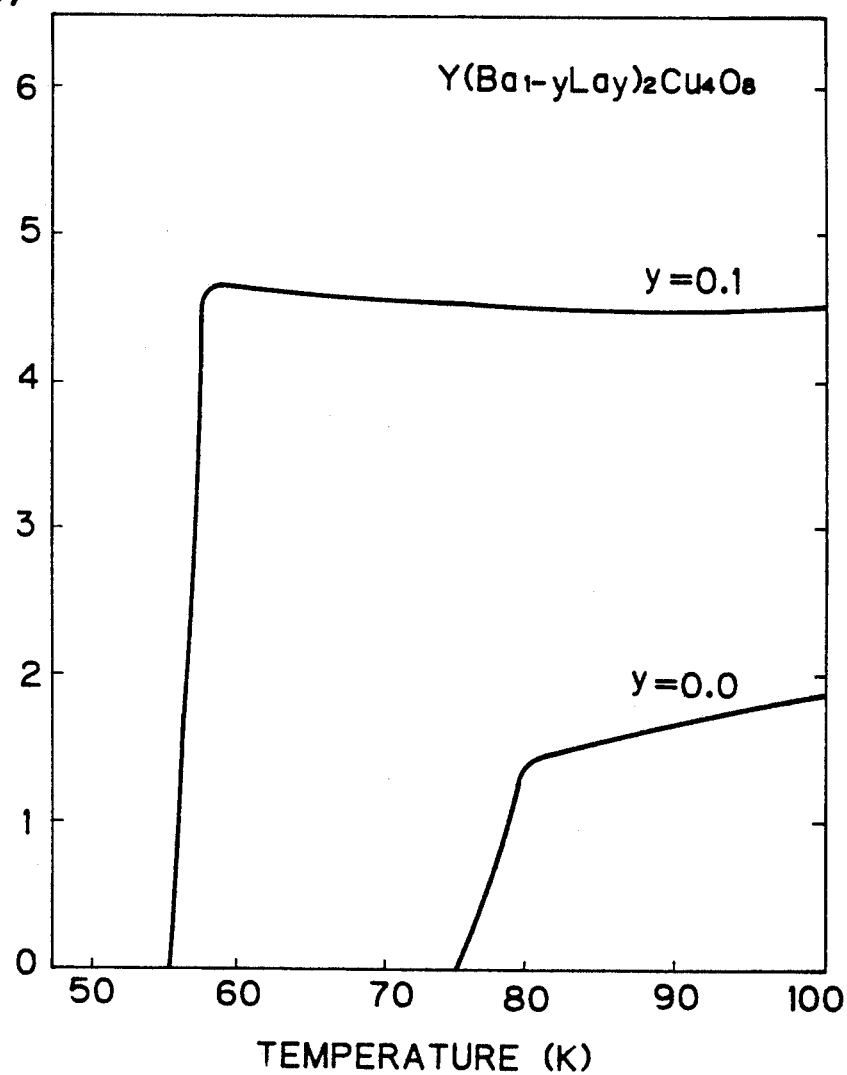
FIG. 4 is a graph showing temperature-resistivity characteristics of $Y(Ba_{1-y}La_y)_2Cu_4O_8$ obtained in Example 1.
Figure 5:
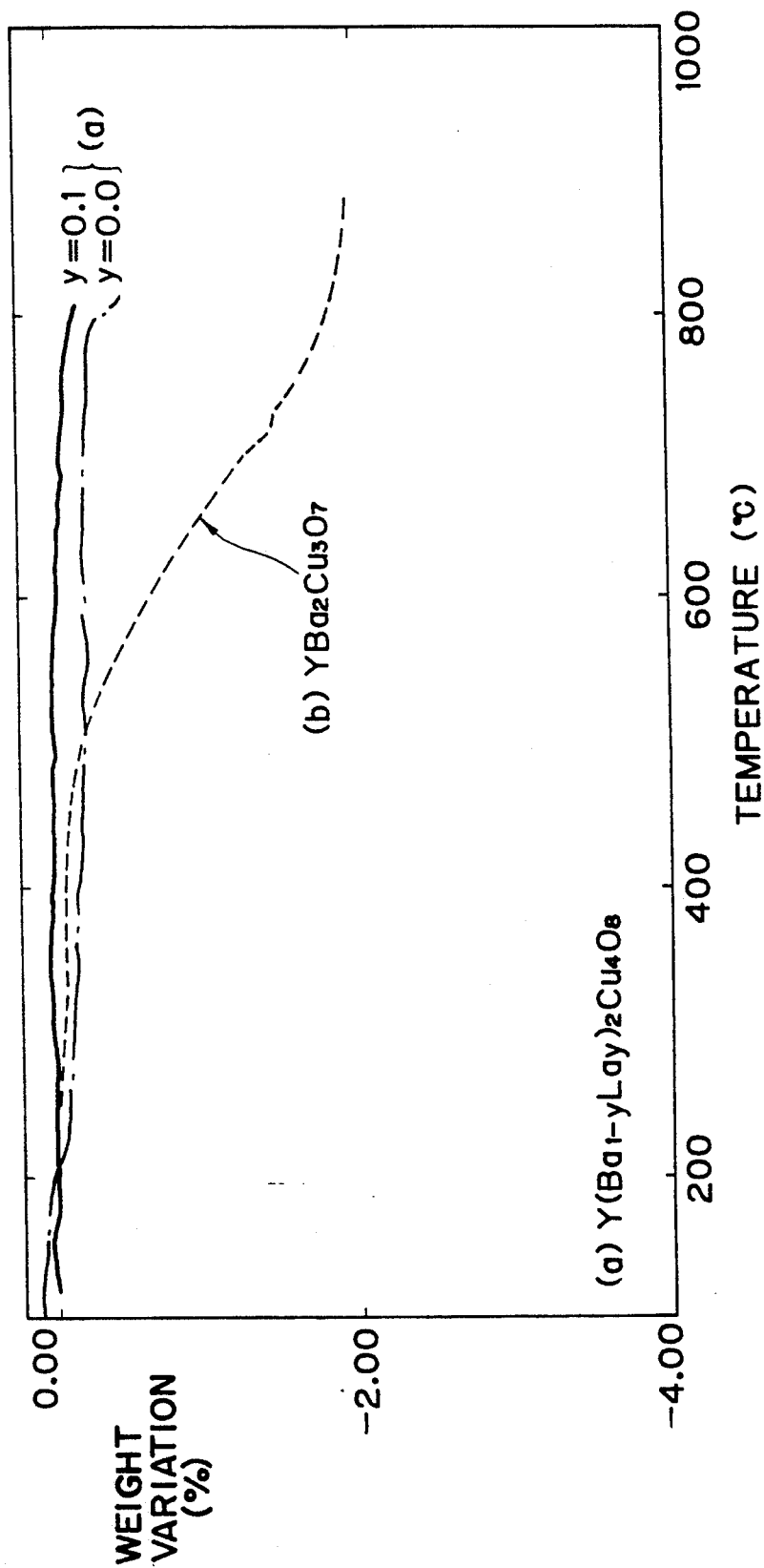
FIG. 5 is a graph showing the results of thermogravimetric analysis of $Y(Ba_{1-y}La_y)_2Cu_4O_8$ obtained in Example 1 and of $YBa_2Cu_3O_7$.

This product was then subjected to powder X-ray diffraction analysis and thermogravimetric analysis and was further tested for temperature dependence of the resistivity thereof. The results are summarized in Table 1, in which $Tc^{onset}$ refers to an onset Tc which is a temperature at which the material starts transition from the normal conductive state to superconductive state and $Tc^{R=0}$ refers to perfect Tc which is a temperature at which the material has completely become superconductive state (the resistivity has become 0). The powder X-ray diffraction pattern of the product in the case of y=0.1 is shown in FIG. 3 while temperature dependency of resistivity and change in weight in thermogravimetry of the products (y=0 and y=0.1) are shown in FIGS. 4 and 5, respectively.

TABLE 1

| Test No. | y | Crystallographic Phase by X-Ray Diffraction | $Tc^{onset}$ (K) | $Tc^{R=0}$ (K) |
|---|---|---|---|---|
| 1* | 0 | $YBa_2Cu_4O_8$ single phase | 80 | 75 |
| 2 | 0.01 | $YBa_2Cu_4O_8$ single phase | 78 | 74 |
| 3 | 0.05 | $YBa_2Cu_4O_8$ single phase | 71 | 66 |
| 4 | 0.10 | $YBa_2Cu_4O_8$ single phase | 58 | 55 |
| 5 | 0.20 | $YBa_2Cu_4O_8$ single phase | 40 | 37 |
| 6 | 0.30 | $YBa_2Cu_4O_8$ single phase | 19 | 15 |
| 7* | 0.40 | $YBa_2Cu_4O_8$ single phase | — | — |

*Comparative Test

From the results shown in Table 1 and FIG. 4, Tc reduces with the increase of the La content. Thus, it is possible to control Tc by control of La content. When y=0.4, the sintered product becomes an insulator. As seen from the results shown in FIG. 5, the sintered product with y=0.1 is stable up to about 850° C., whereas conventional $YBa_2Cu_3O_7$ loses its oxygen at temperatures above about 400° C.

EXAMPLE 2

Figure 6:
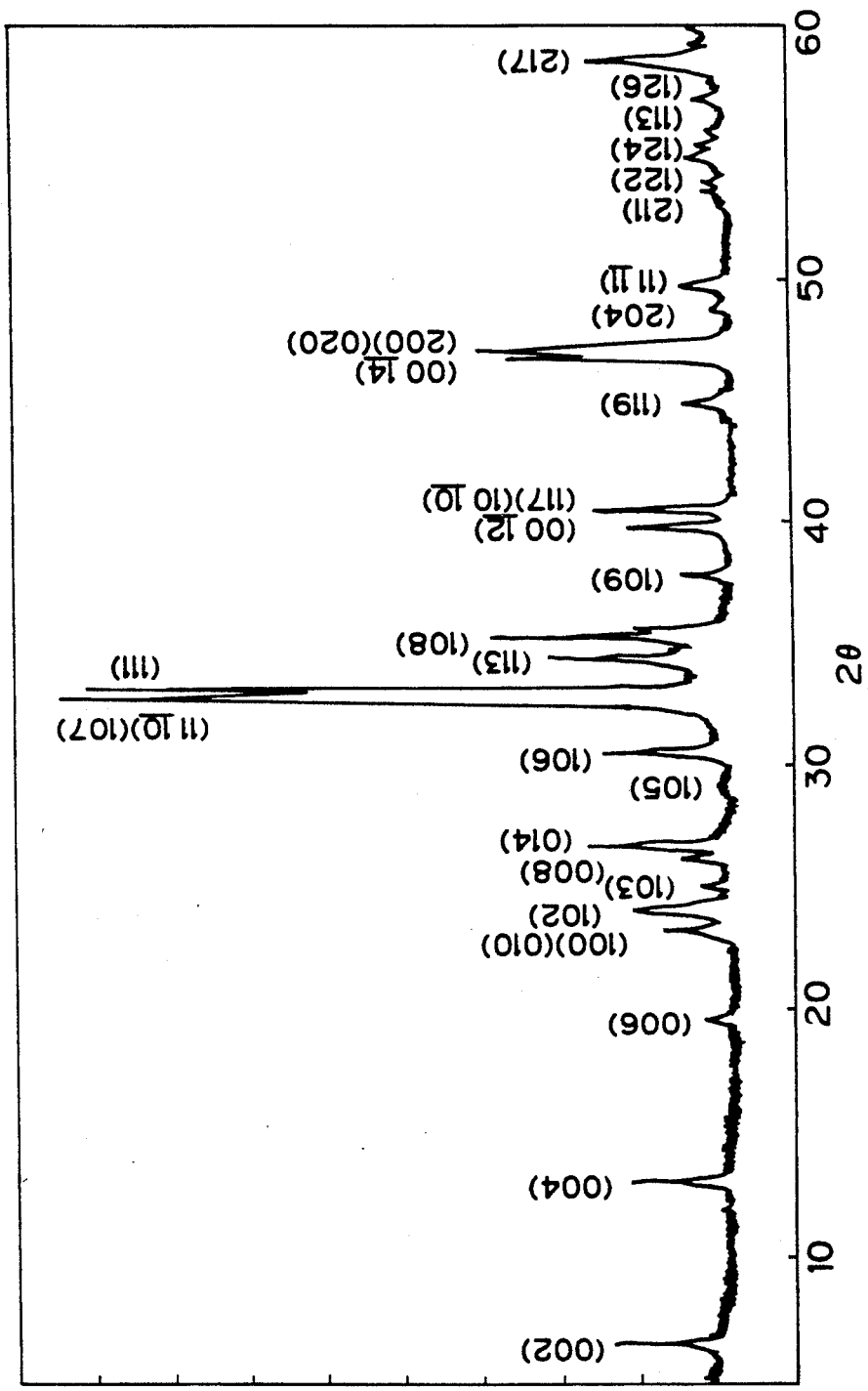
FIG. 6 is a powder X-ray diffraction pattern of $Ho(Ba_{0.9}La_{0.1})_2Cu_4O_8$ obtained in Example 2.
Figure 7:
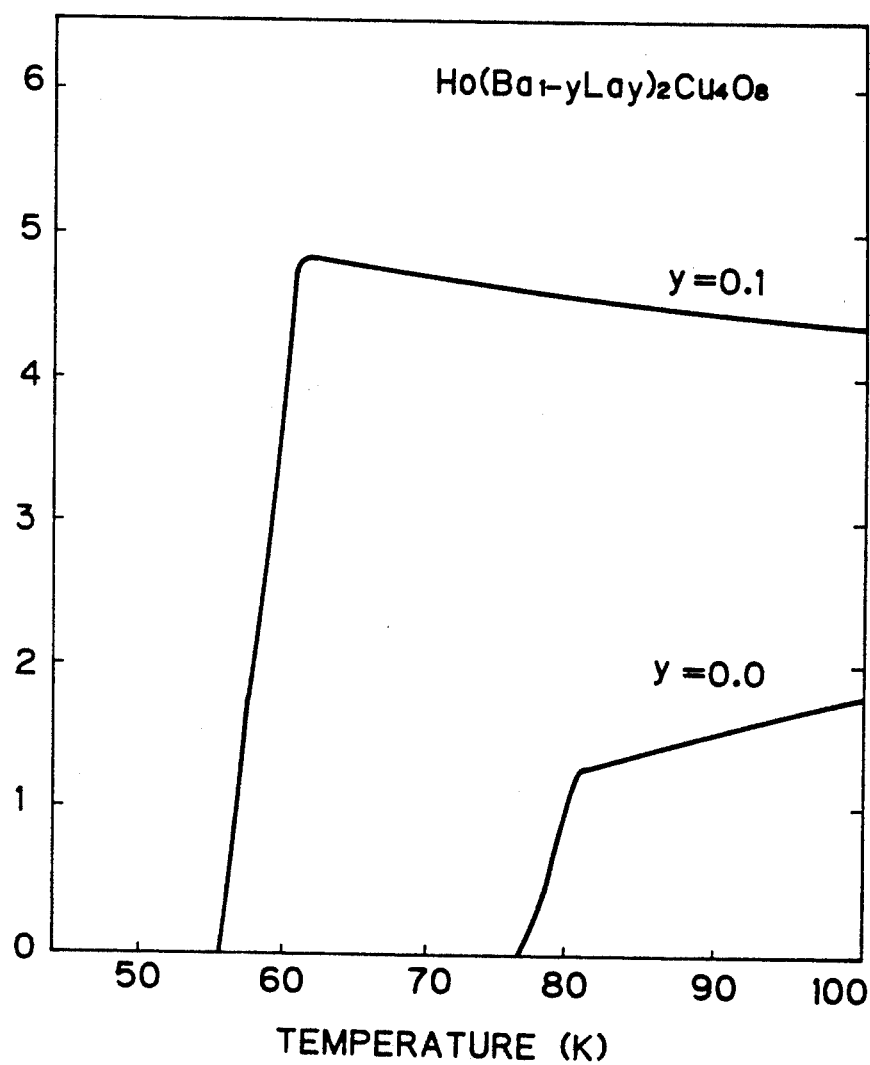
FIG. 7 is a graph showing temperature-resistivity characteristics of $Ho(Ba_{1-y}La_y)_2Cu_4O_8$ obtained in Example 2.
Figure 8:
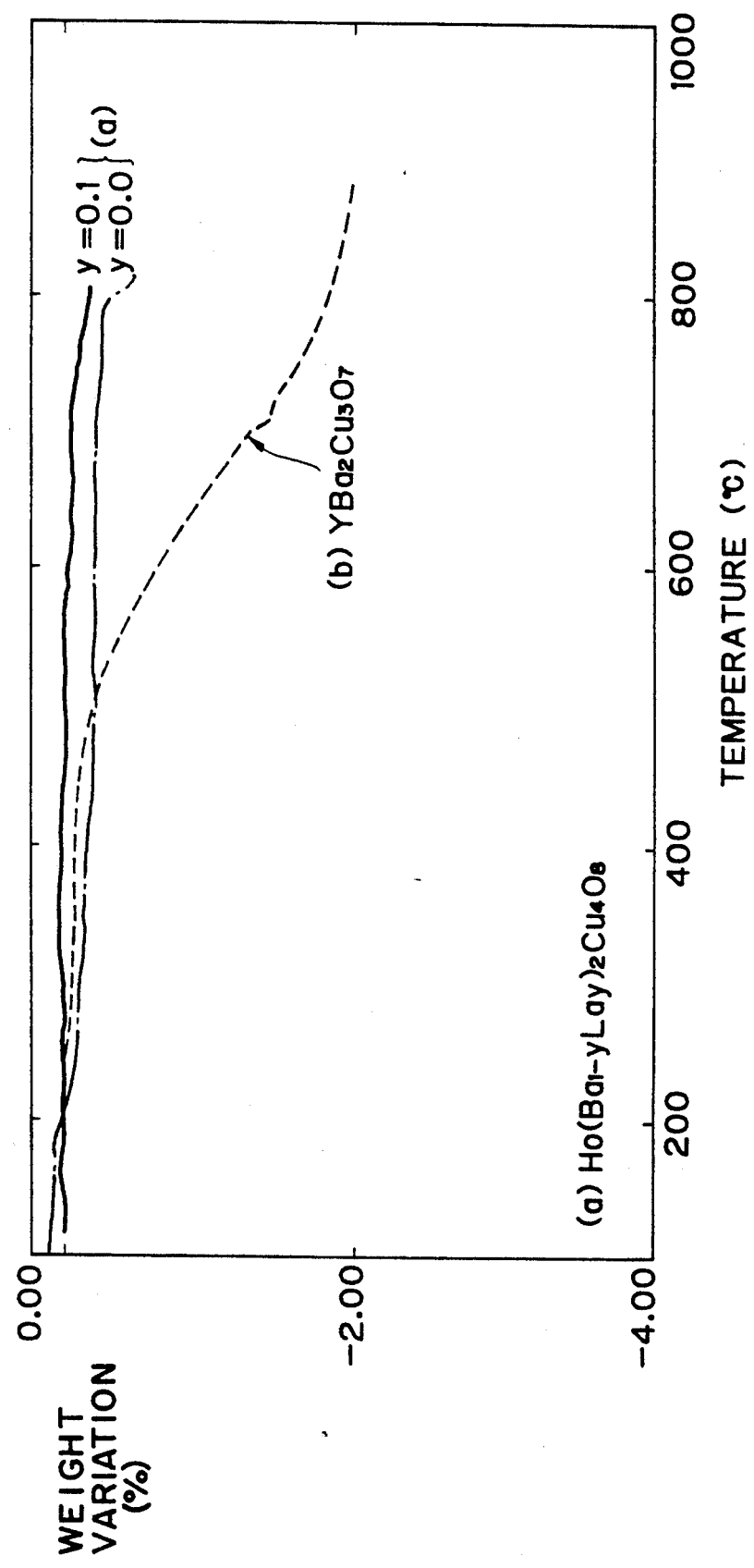
FIG. 8 is a graph showing the results of thermogravimetric analysis of $Ho(Ba_{1-y}La_y)_2Cu_4O_8$ obtained in Example 2 and of $YBa_2Cu_3O_7$.

Example 1 was repeated in the same manner as described except that $Ho_2O_3$ was used in place of $Y_2O_3$, thereby to produce $Ho(Ba_{1-y}La_y)_2Cu_4O_8$ wherein y=0, 0.01, 0.05, 0.1, 0.2, 0.3 and 0.4. The product was then tested in the same manner as that in Example 1. The results are summarized in Table 2. The powder X-ray diffraction pattern of the product in the case of y=0.1 is shown in FIG. 6 while temperature dependency of resistivity and change in weight in thermogravimetry of the products (y=0 and y=0.1) are shown in FIGS. 7 and 8, respectively.

TABLE 2

| Test No. | y | Crystallographic Phase by X-Ray Diffraction | $T_c^{onset}$ (K) | $T_c^{R=0}$ (K) |
|---|---|---|---|---|
| 8* | 0 | $YBa_2Cu_4O_8$ single phase | 81 | 76 |
| 9 | 0.01 | $YBa_2Cu_4O_8$ single phase | 79 | 75 |
| 10 | 0.05 | $YBa_2Cu_4O_8$ single phase | 70 | 65 |
| 11 | 0.10 | $YBa_2Cu_4O_8$ single phase | 61 | 56 |
| 12 | 0.20 | $YBa_2Cu_4O_8$ single phase | 38 | 35 |
| 13 | 0.30 | $YBa_2Cu_4O_8$ single phase | 21 | 18 |
| 14* | 0.40 | $YBa_2Cu_4O_8$ single phase | — | — |

*Comparative Test

From the results shown in Table 2 and FIG. 7, Tc reduces with the increase of the La content. Thus, it is possible to control Tc by control of La content. When y=0.4, the sintered product becomes an insulator. As seen from the results shown in FIG. 8, the sintered product with y=0.1 is stable up to about 850° C.

EXAMPLE 3

Metal oxide compositions having the formula $R(Ba_{0.9}La_{0.1})_2Cu_4O_8$ (R=Nd, Sm, Eu, Gd, Dy, Er, Tm, Yb and Lu) were prepared in the same manner as that in Example 1. The resulting products were tested for temperature dependence of the resistivity thereof. The results are summarized in Table 3.

TABLE 3

| Test No. | R | Crystallographic Phase by X-Ray Diffraction | $T_c^{onset}$ (K) | $T_c^{R=0}$ (K) |
|---|---|---|---|---|
| 15 | Nd | $YBa_2Cu_4O_8$ single phase | 59 | 55 |
| 16 | Sm | $YBa_2Cu_4O_8$ single phase | 60 | 56 |
| 17 | Eu | $YBa_2Cu_4O_8$ single phase | 58 | 55 |
| 18 | Gd | $YBa_2Cu_4O_8$ single phase | 61 | 56 |
| 19 | Dy | $YBa_2Cu_4O_8$ single phase | 62 | 57 |
| 20 | Er | $YBa_2Cu_4O_8$ single phase | 63 | 57 |
| 21 | Tm | $YBa_2Cu_4O_8$ with impurity phase | 62 | 60 |
| 22 | Yb | $YBa_2Cu_4O_8$ with impurity phase | 61 | 54 |
| 23 | Lu | $YBa_2Cu_4O_8$ with impurity phase | 61 | 53 |

The results shown in Table 3 indicate that the addition of La is effective in controlling Tc of various rare earth-containing superconductors.

EXAMPLE 4

Metal oxide compositions having the formula $(Y_{1-z}Ho_z)(Ba_{0.9}La_{0.1})_2Cu_4O_8$ (z=0.2, 0.4, 0.6 and 0.8) were prepared in the same manner as that in Example 1. The resulting products were tested for temperature dependence of the resistivity thereof. The results are summarized in Table 4.

TABLE 4

| Test No. | z | Crystallographic Phase by X-Ray Diffraction | $T_c^{onset}$ (K) | $T_c^{R=0}$ (K) |
|---|---|---|---|---|
| 24 | 0.2 | superconductive single phase | 60 | 56 |
| 25 | 0.4 | superconductive single phase | 60 | 57 |
| 26 | 0.6 | superconductive single phase | 61 | 56 |
| 27 | 0.8 | superconductive single phase | 60 | 56 |

The results shown in Table 4 indicate that the addition of La is effective in controlling Tc of superconducting material containing two rare earth elements with various mixing ratios.

EXAMPLE 5

Metal oxide compositions having the formula $(R_{1-x}Ca_x)(Ba_{1-y}La_y)_2Cu_4O_8$ wherein R, x and y are numbers as shown in Table 5a were prepared. Thus, quantities of $R_2O_3$ powder, CaO powder, $Ba(NO_3)_2$ powder, CuO powder and $La_2O_3$ were mixed in an inert gas atmosphere and the mixture was calcined, under an oxygen stream, at a temperature as indicated in Table 5b for 10 hours. The calcined mass was ground and formed into a rectangular block, followed by heating at a pre-sintering temperature as indicated in Table 5b under an oxygen stream for 5 hours. The resulting pre-sintered sample was then heat-treated in an mixed gas atmosphere of 80% argon and 20% oxygen at a pressure of 1,000 kg/cm². The heat treatment was performed by heating the sample to 1000° C. with a heating rate of 200° C./hour and then maintaining at that temperature for 10 hours. Thereafter, the sample was cooled to 300° C. with a cooling rate of 200° C./hour. The pressure was then released and the treated sample was allowed to stand in air, ground, shaped and sintered again at 800° C. for 20 hours under an oxygen stream to obtain a sintered product. This product was then subjected to powder X-ray diffraction analysis and thermogravimetric analysis and was further tested for the temperature dependence of resistivity and alternate current-magnetic susceptibility. The results are shown in Table 5b and in FIGS. 9-12.

TABLE 5a

| Test No. | R | x | y | Raw Materials | Ba Content (mol %) |
|---|---|---|---|---|---|
| 28 | Y | 0.001 | 0.001 | $Y_2O_3$ CaO $Ba(NO_3)_2$ $La_2O_3$ CuO | 13.32 |
| 29 | Y+Er** | 0.001 | 0.05 | $Y_2O_3$ CaO $Ba(NO_3)_2$ $La_2O_3$ CuO $Er_2O_3$ | 12.67 |
| 30 | Er | 0.001 | 0.1 | $Er_2O_3$ CaO $Ba(NO_3)_2$ $La_2O_3$ CuO | 12.00 |
| 31 | Tm | 0.001 | 0.2 | $Tm_2O_3$ CaO $Ba(NO_3)_2$ $La_2O_3$ CuO | 10.67 |
| 32 | Gd | 0.1 | 0.001 | $Gd_2O_3$ CaO $Ba(NO_3)_2$ $La_2O_3$ CuO | 13.32 |
| 33 | Dy | 0.1 | 0.1 | $Dy_2O_3$ CaO $Ba(NO_3)_2$ $La_2O_3$ CuO | 12.00 |
| 34 | Y | 0.1 | 0.2 | $Y_2O_3$ CaO $Ba(NO_3)_2$ $La_2O_3$ CuO | 10.67 |
| 35 | Sm | 0.3 | 0.001 | $Sm_2O_3$ CaO $Ba(NO_3)_2$ $La_2O_3$ CuO | 13.32 |
| 36 | Nd | 0.3 | 0.1 | $Nd_2O_3$ CaO $Ba(NO_3)_2$ $La_2O_3$ CuO | 12.00 |
| 37 | Sm+Er** | 0.3 | 0.1 | $Sm_2O_3$ CaO $Ba(NO_3)_2$ $La_2O_3$ CuO $Er_2O_3$ | 12.00 |
| 38 | Ho | 0.3 | 0.2 | $Ho_2O_3$ CaO $Ba(NO_3)_2$ $La_2O_3$ CuO | 10.67 |
| 39* | Y | 0.0 | 0.0 | $Y_2O_3$ $Ba(NO_3)_2$ CuO | 13.33 |

TABLE 5a-continued

| Test No. | R | x | y | Raw Materials | Ba Content (mol %) |
|---|---|---|---|---|---|
| 40* | Nd | 0.0 | 0.0 | $Nd_2O_3$ $Ba(NO_3)_2$ CuO | 13.33 |
| 41* | Sm | 0.0 | 0.0 | $Sm_2O_3$ $Ba(NO_3)_2$ CuO | 13.33 |
| 42* | Eu | 0.0 | 0.0 | $Eu_2O_3$ $Ba(NO_3)_2$ CuO | 13.33 |
| 43* | Gd | 0.0 | 0.0 | $Gd_2O_3$ $Ba(NO_3)_2$ CuO | 13.33 |
| 44* | Dy | 0.0 | 0.0 | $Dy_2O_3$ $Ba(NO_3)_2$ CuO | 13.33 |
| 45* | Ho | 0.0 | 0.0 | $Ho_2O_3$ $Ba(NO_3)_2$ CuO | 13.33 |
| 46* | Er | 0.0 | 0.0 | $Er_2O_3$ $Ba(NO_3)_2$ CuO | 13.33 |
| 47* | Tm | 0.0 | 0.0 | $Tm_2O_3$ $Ba(NO_3)_2$ CuO | 13.33 |
| 48* | Y | 0.001 | 0.3 | $Y_2O_3$ CaO $Ba(NO_3)_2$ $La_2O_3$ CuO | 9.33 |
| 49* | Eu | 0.1 | 0.3 | $Eu_2O_3$ CaO $Ba(NO_3)_2$ $La_2O_3$ CuO | 9.33 |
| 50* | Y | 0.4 | 0.01 | $Y_2O_3$ CaO $Ba(NO_3)_2$ $La_2O_3$ CuO | 13.20 |
| 51* | Sm | 0.4 | 0.3 | $Sm_2O_3$ CaO $Ba(NO_3)_2$ $La_2O_3$ CuO | 9.33 |
| 52* | Gd | 0.3 | 0.3 | $Gd_2O_3$ CaO $Ba(NO_3)_2$ $La_2O_3$ CuO | 9.33 |

*Comparative Test
**Equimolar mixture

TABLE 5b

| Test No. | Calcination Temperature (°C.) | Pre-sintering Temperature (°C.) | Crystallographic Phase by X-Ray Diffraction | Tc (K) |
|---|---|---|---|---|
| 28 | 750 | 850 | $YBa_2Cu_4O_8$ | 84 |
| 29 | 750 | 830 | $YBa_2Cu_4O_8$ | 84 |
| 30 | 750 | 830 | $YBa_2Cu_4O_8$ | 83 |
| 31 | 700 | 830 | $YBa_2Cu_4O_8$ | 83 |
| 32 | 750 | 800 | $YBa_2Cu_4O_8$ | 83 |
| 33 | 700 | 820 | $YBa_2Cu_4O_8$ | 83 |
| 34 | 720 | 800 | $YBa_2Cu_4O_8$ | 81 |
| 35 | 750 | 820 | $YBa_2Cu_4O_8, BaCuO_2$ | 82 |
| 36 | 700 | 850 | $YBa_2Cu_4O_8, BaCuO_2$ | 80 |
| 37 | 710 | 830 | $YBa_2Cu_4O_8, BaCuO_2$ | 82 |
| 38 | 700 | 820 | $YBa_2Cu_4O_8, BaCuO_2$ | 80 |
| 39* | 800 | 900 | $YBa_2Cu_4O_8$ | 82 |
| 40* | 750 | 920 | $YBa_2Cu_4O_8$ | 80 |
| 41* | 800 | 900 | $YBa_2Cu_4O_8$ | 82 |
| 42* | 800 | 900 | $YBa_2Cu_4O_8$ | 82 |
| 43* | 800 | 900 | $YBa_2Cu_4O_8$ | 82 |
| 44* | 800 | 900 | $YBa_2Cu_4O_8$ | 83 |
| 45* | 800 | 900 | $YBa_2Cu_4O_8$ | 83 |
| 46* | 800 | 900 | $YBa_2Cu_4O_8$ | 81 |
| 47* | 800 | 900 | $YBa_2Cu_4O_8$ | 81 |
| 48* | 700 | 850 | $YBa_2Cu_4O_8$ | 40 |
| 49* | 700 | 800 | $YBa_2Cu_4O_8, BaCuO_2$ | — |
| 50* | 750 | 800 | $YBa_2Cu_4O_8, BaCuO_2$ | — |
| 51* | 700 | 850 | $YBa_2Cu_4O_8, BaCuO_2, Sm_2O_3$ | — |
| 52* | 720 | 850 | $YBa_2Cu_4O_8, BaCuO_2, Gd_2O_3$ | — |

*Comparative Test

Figure 9:
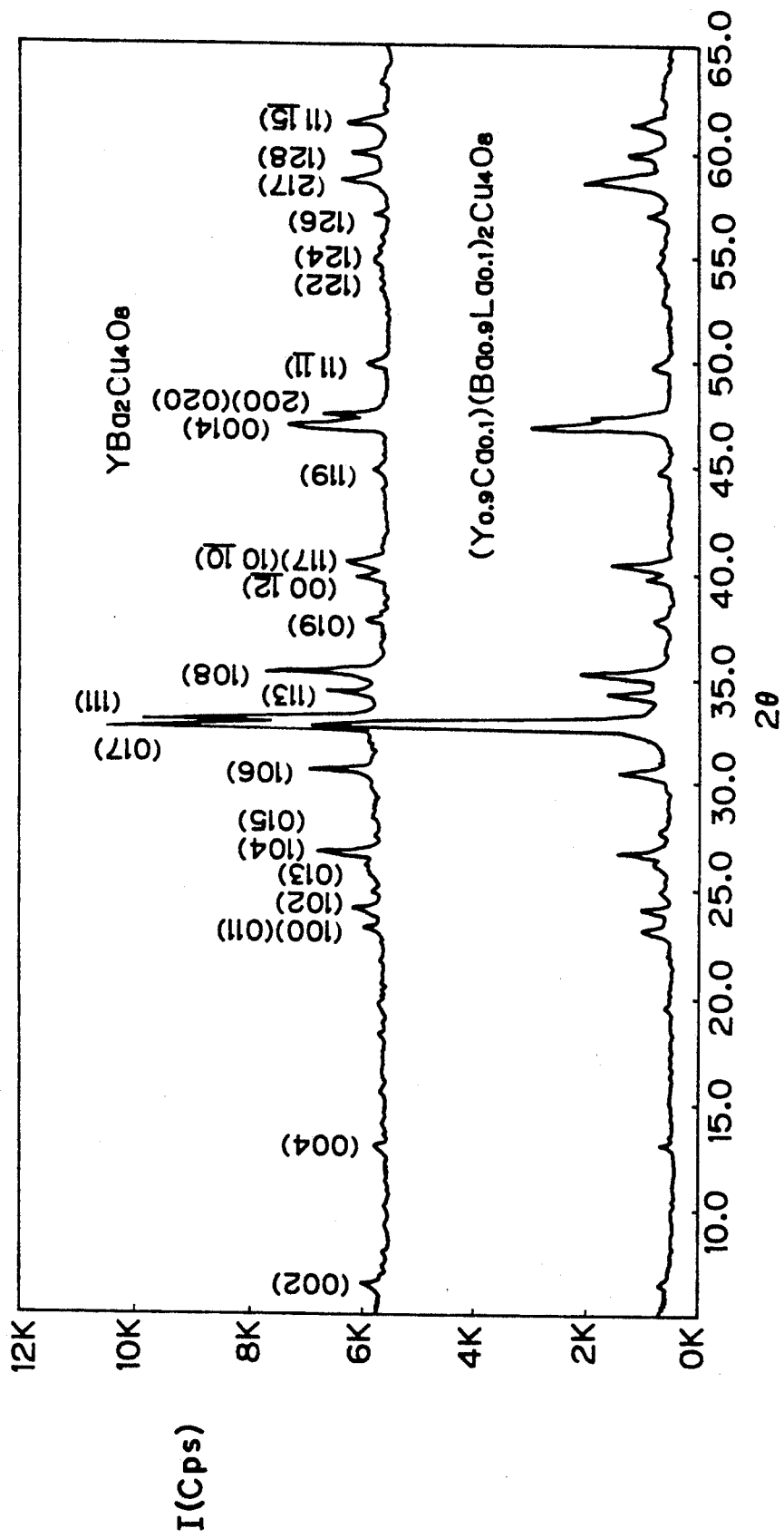
FIG. 9 shows powder X-ray diffraction patterns of $YBa_2Cu_4O_8$ and $(Y_{0.9}Ca_{0.1})(Ba_{0.9}La_{0.1})_2Cu_4O_8$ obtained in Example 5.
Figure 10:
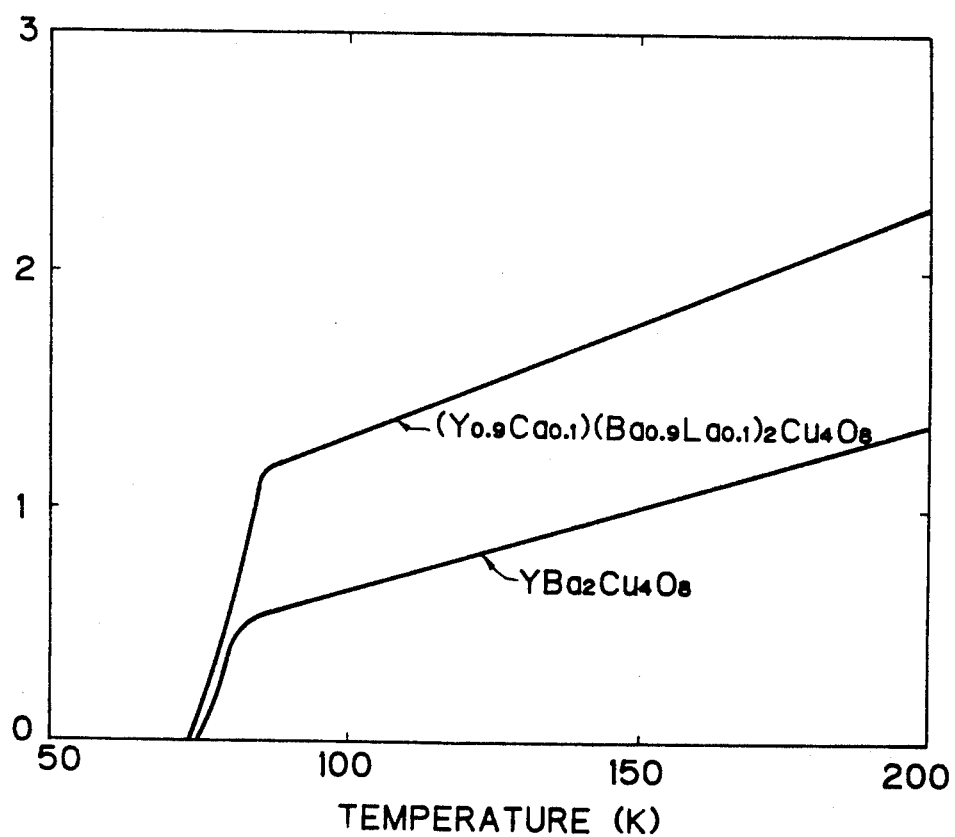
FIG. 10 is a graph showing temperature-resistivity characteristics of $YBa_2Cu_4O_8$ and $(Y_{0.9}Ca_{0.1})(Ba_{0.9}La_{0.1})_2Cu_4O_8$ obtained in Example 5.

The x-ray diffraction pattern shown in FIG. 9 (x=0.1, y=0.1) indicates the presence of the $YBa_2Cu_4O_8$ crystal phase. The sintered samples with x of 0–0.15 and y of 0–0.1 were found to have a single layer superconducting phase. From the results summarized in Table 5 and in FIG. 10, it is seen that the addition of Ca and La in specific amounts is effective in reducing the amount of Ba while maintaining Tc above about 80K.

Figure 11:
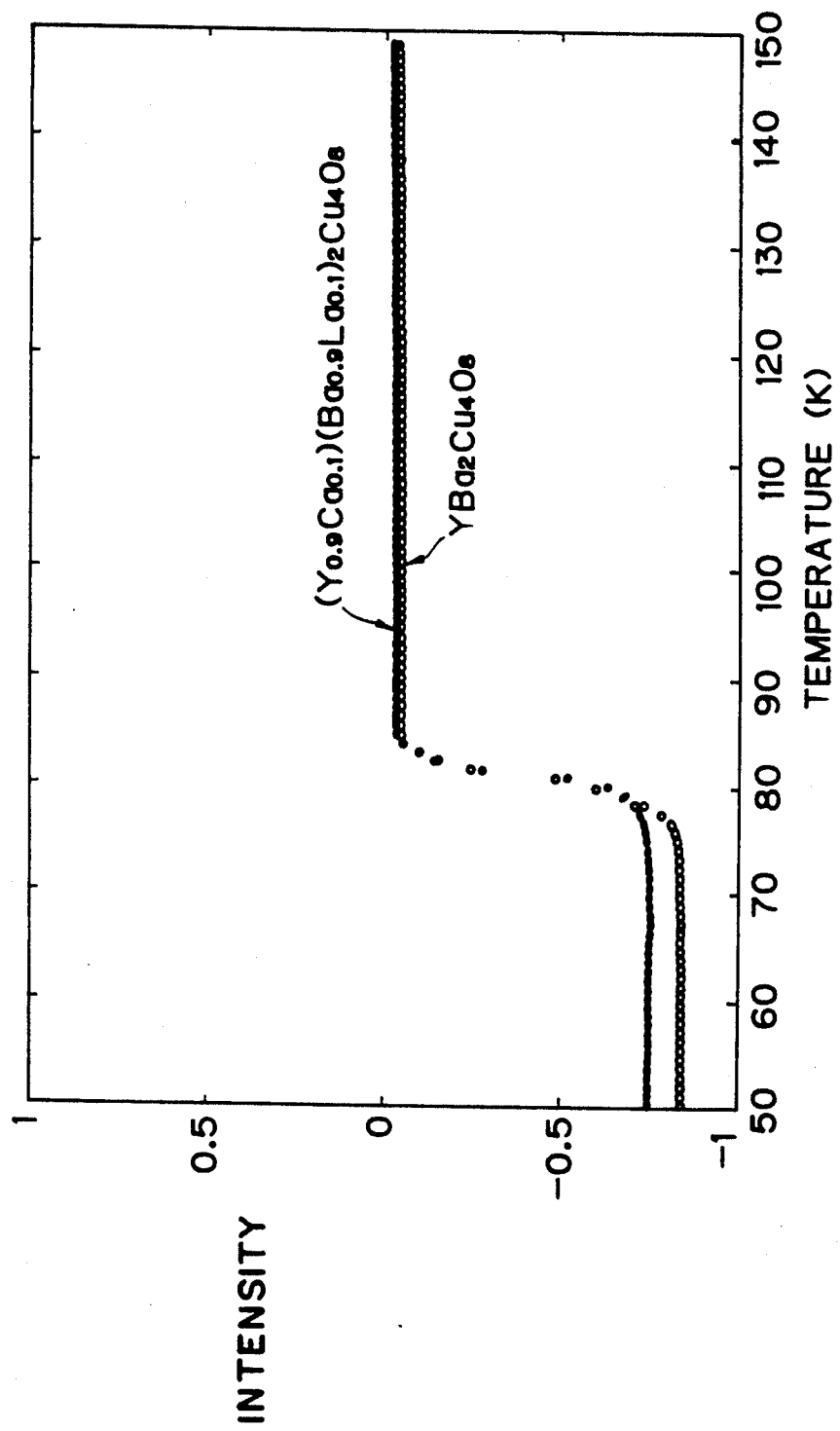
FIG. 11 is a graph showing the results of measurement of alternating-current magnetic susceptibility of $YBa_2Cu_4O_8$ and $(Y_{0.9}Ca_{0.1})(Ba_{0.9}La_{0.1})_2Cu_4O_8$ obtained in Example 5.
Figure 12:
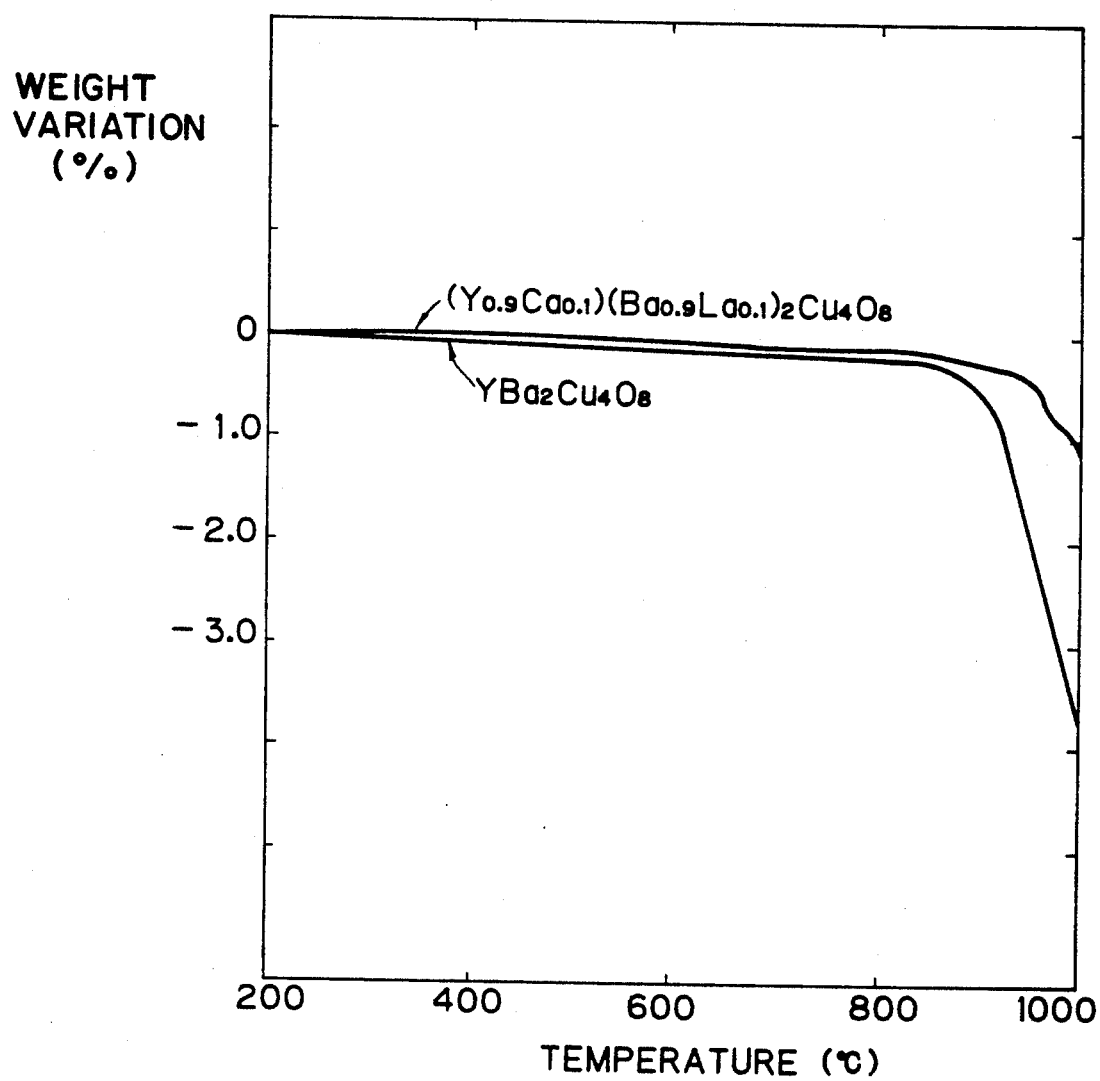
FIG. 12 is a graph showing the results of thermogravimetric analysis of $YBa_2Cu_4O_8$ and $(Y_{0.9}Ca_{0.1})(Ba_{0.9}La_{0.1})_2Cu_4O_8$ obtained in Example 5.

The high Tc is also confirmed by the results shown in FIG. 11 indicating the occurrence of diamagnetism at a temperature of above about 80K. As seen from the results shown in FIG. 12, the sintered product with x=0.1 and y=0.1 is stable up to about 850° C., similar to $YBa_2Cu_4O_8$.

EXAMPLE 6

Metal oxide compositions having the formula: $(R_{1-x}Ca_x)(Ba_{1-y}La_y)_2Cu_4O_8$ wherein R, x and y are numbers as shown in Table 6a were prepared. Thus, quantities of $R_2O_3$ powder, CaO powder, $BaCO_3$ powder, CuO powder and $La_2O_3$ were mixed in an inert gas atmosphere and the mixture was calcined, under an oxygen stream, at a temperature as indicated in Table 6b for 10 hours. The calcined mass was ground and formed into a rectangular block, followed by heating at a pre-sintering temperature as indicated in Table 6b under an oxygen stream for 5 hours. The resulting pre-sintered sample was then heat-treated in an mixed gas atmosphere of 80% argon and 20% oxygen at a pressure of 1,000 kg/cm². The heat treatment was performed by heating the sample to 1000° C. with a heating rate of 200° C./hour and then maintaining at that temperature for 10 hours. Thereafter, the sample was cooled to 300° C. with a cooling rate of 200° C./hour. The pressure was then released and the treated sample was allowed to stand in air, ground, shaped and sintered again at 800° C. for 20 hours under an oxygen stream to obtain a sintered product. This product was then subjected to powder X-ray diffraction analysis and thermogravimetric analysis and was further tested for the temperature dependence of resistivity and alternate current-magnetic susceptibility. The results are shown in Table 6b and in FIGS. 13–16.

TABLE 6a

| Test No. | R | x | y | Raw Materials | Ba Content (mol %) |
|---|---|---|---|---|---|
| 53 | Y | 0.001 | 0.001 | $Y_2O_3$ $CaCO_3$ $BaCO_3$ $La_2O_3$ CuO | 13.32 |
| 54 | Y+Er** | 0.001 | 0.05 | $Y_2O_3$ $CaCO_3$ $BaCO_3$ $La_2O_3$ CuO $Er_2O_3$ | 12.67 |
| 55 | Er | 0.001 | 0.1 | $Er_2O_3$ $CaCO_3$ $BaCO_3$ $La_2O_3$ CuO | 12.00 |
| 56 | Tm | 0.001 | 0.2 | $Tm_2O_3$ $CaCO_3$ $BaCO_3$ $La_2O_3$ CuO | 10.67 |
| 57 | Gd | 0.1 | 0.001 | $Gd_2O_3$ $CaCO_3$ $BaCO_3$ $La_2O_3$ CuO | 13.32 |
| 58 | Dy | 0.1 | 0.05 | $Dy_2O_3$ $CaCO_3$ $BaCO_3$ $La_2O_3$ CuO | 12.67 |
| 59 | Y | 0.1 | 0.1 | $Y_2O_3$ $CaCO_3$ $BaCNO_3$ $La_2O_3$ CuO | 12.00 |
| 60 | Sm | 0.1 | 0.2 | $Sm_2O_3$ $CaCO_3$ $BaCO_3$ $La_2O_3$ CuO | 10.67 |
| 61 | Nd | 0.3 | 0.001 | $Nd_2O_3$ $CaCO_3$ $BaCO_3$ $La_2O_3$ CuO | 13.32 |
| 62 | Sm+Er** | 0.3 | 0.1 | $Sm_2O_3$ $CaCO_3$ $BaCO_3$ $La_2O_3$ CuO $Er_2O_3$ | 12.00 |
| 63 | Ho | 0.3 | 0.1 | $Ho_2O_3$ $CaCO_3$ $BaCO_3$ $La_2O_3$ CuO | 12.00 |
| 64 | Y | 0.3 | 0.2 | $Y_2O_3$ $CaCO_3$ $BaCO_3$ $La_2O_3$ CuO | 10.67 |

TABLE 6a-continued

| Test No. | R | x | y | Raw Materials | Ba Content (mol %) |
|---|---|---|---|---|---|
| 65 | Eu | 0.3 | 0.2 | $Eu_2O_3$ $CaCO_3$ $BaCO_3$ $La_2O_3$ CuO | 10.67 |
| 66* | Y | 0.001 | 0.3 | $Y_2O_3$ $CaCO_3$ $BaCO_3$ $La_2O_3$ CuO | 9.33 |
| 67* | Eu | 0.1 | 0.3 | $Eu_2O_3$ $CaCO_3$ $BaCO_3$ $La_2O_3$ CuO | 9.33 |
| 68* | Y | 0.4 | 0.01 | $Y_2O_3$ $CaCO_3$ $BaCO_3$ $La_2O_3$ CuO | 13.20 |
| 69* | Ho | 0.4 | 0.3 | $Ho_2O_3$ $CaCO_3$ $BaCO_3$ $La_2O_3$ CuO | 9.33 |
| 70* | Gd | 0.3 | 0.3 | $Gd_2O_3$ $CaCO_3$ $BaCO_3$ $La_2O_3$ CuO | 9.33 |
| 71* | Y | 0.1 | 0.1 | $Y_2O_3$ $CaCO_3$ $BaO_3$ $La_2O_3$ CuO | 12.00 |

*Comparative Test
**Equimolar mixture

TABLE 6b

| Test No. | Calcination Temperature (°C.) | Pre-sintering Temperature (°C.) | Crystallographic Phase by X-Ray Diffraction | Tc (K) |
|---|---|---|---|---|
| 53 | 900 | 950 | $YBa_2Cu_4O_8$ | 83 |
| 54 | 920 | 950 | $YBa_2Cu_4O_8$ | 83 |
| 55 | 900 | 950 | $YBa_2Cu_4O_8$ | 83 |
| 56 | 920 | 950 | $YBa_2Cu_4O_8$ | 83 |
| 57 | 910 | 940 | $YBa_2Cu_4O_8$ | 83 |
| 58 | 920 | 950 | $YBa_2Cu_4O_8$ | 82 |
| 59 | 910 | 940 | $YBa_2Cu_4O_8$ | 83 |
| 60 | 910 | 950 | $YBa_2Cu_4O_8$ | 82 |
| 61 | 900 | 950 | $YBa_2Cu_4O_8, BaCuO_2$ | 83 |
| 62 | 910 | 940 | $YBa_2Cu_4O_8, BaCuO_2$ | 83 |
| 63 | 900 | 950 | $YBa_2Cu_4O_8, BaCuO_2$ | 82 |
| 64 | 920 | 950 | $YBa_2Cu_4O_8, BaCuO_2$ | 80 |
| 65 | 910 | 940 | $YBa_2Cu_4O_8, BaCuO_2$ | 81 |
| 66* | 900 | 950 | $YBa_2Cu_4O_8, BaCuO_2$ | 40 |
| 67* | 850 | 920 | $YBa_2Cu_4O_8, BaCuO_2$ | 20 |
| 68* | 900 | 950 | $YBa_2Cu_4O_8, BaCuO_2$ | — |
| 69* | 900 | 950 | $YBa_2Cu_4O_8, BaCuO_2$ $Sm_2O_3$ | — |
| 70* | 850 | 910 | $YBa_2Cu_4O_8, BaCuO_2, Gd_2O_3$ | — |
| 71* | 700 | 850 | $YBa_2Cu_4O_8, BaCO_3, Y_2BaCuO_5$ | — |

*Comparative Test

Figure 13:
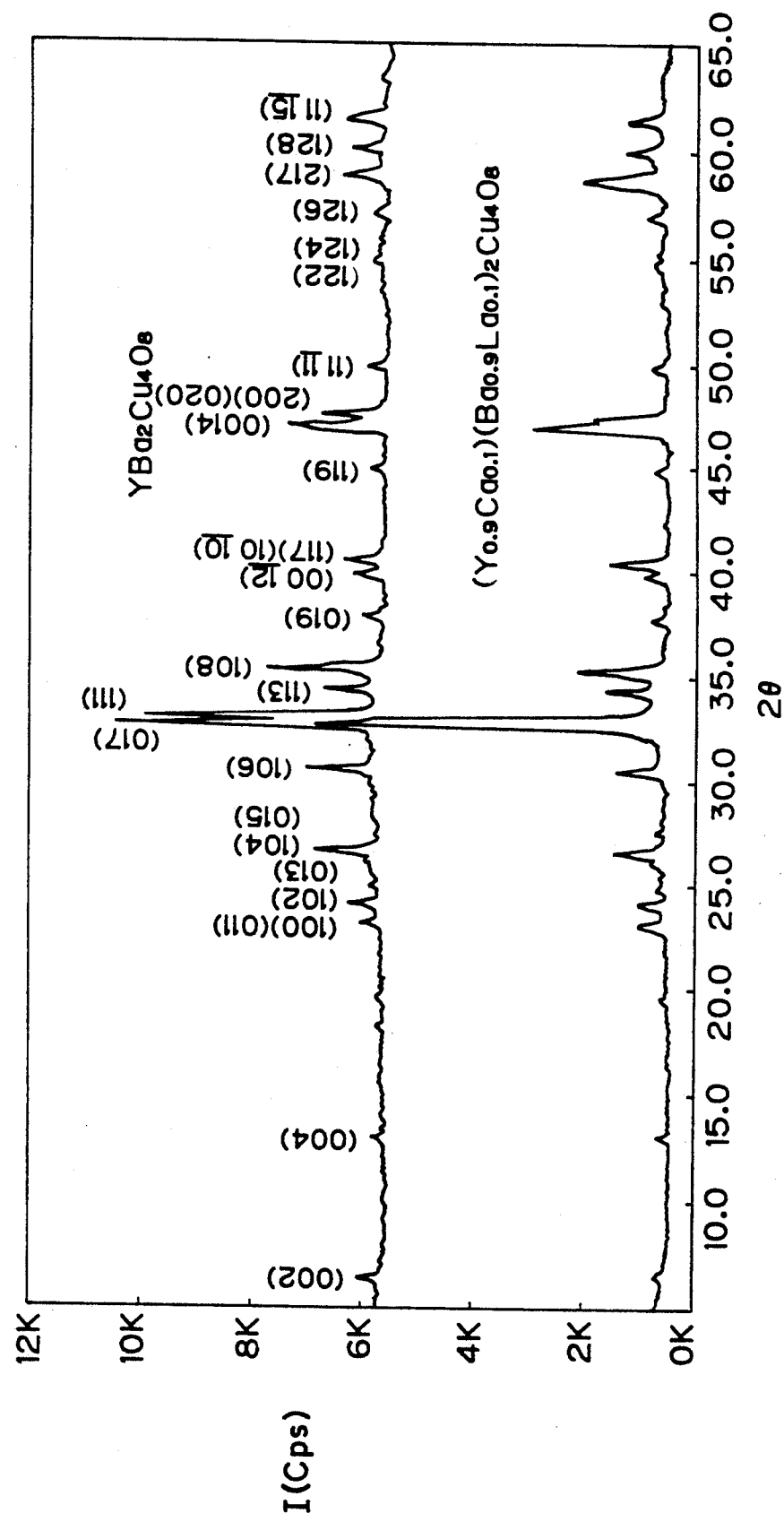
FIG. 13 shows powder X-ray diffraction patterns of $YBa_2Cu_4O_8$ and $(Y_{0.9}Ca_{0.1})(Ba_{0.9}La_{0.1})_2Cu_4O_8$ obtained in Example 6.
Figure 14:
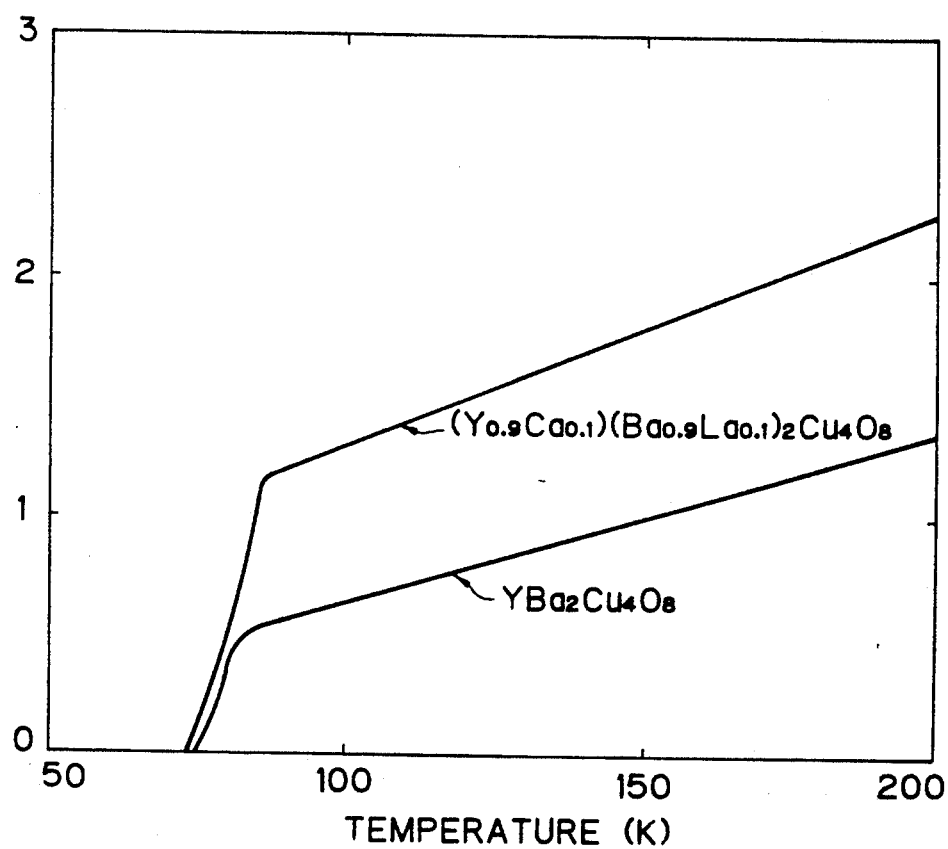
FIG. 14 is a graph showing temperature-resistivity characteristics of $YBa_2Cu_4O_8$ and $(Y_{0.9}Ca_{0.1})(Ba_{0.9}La_{0.1})_2Cu_4O_8$ obtained in Example 6.
Figure 15:
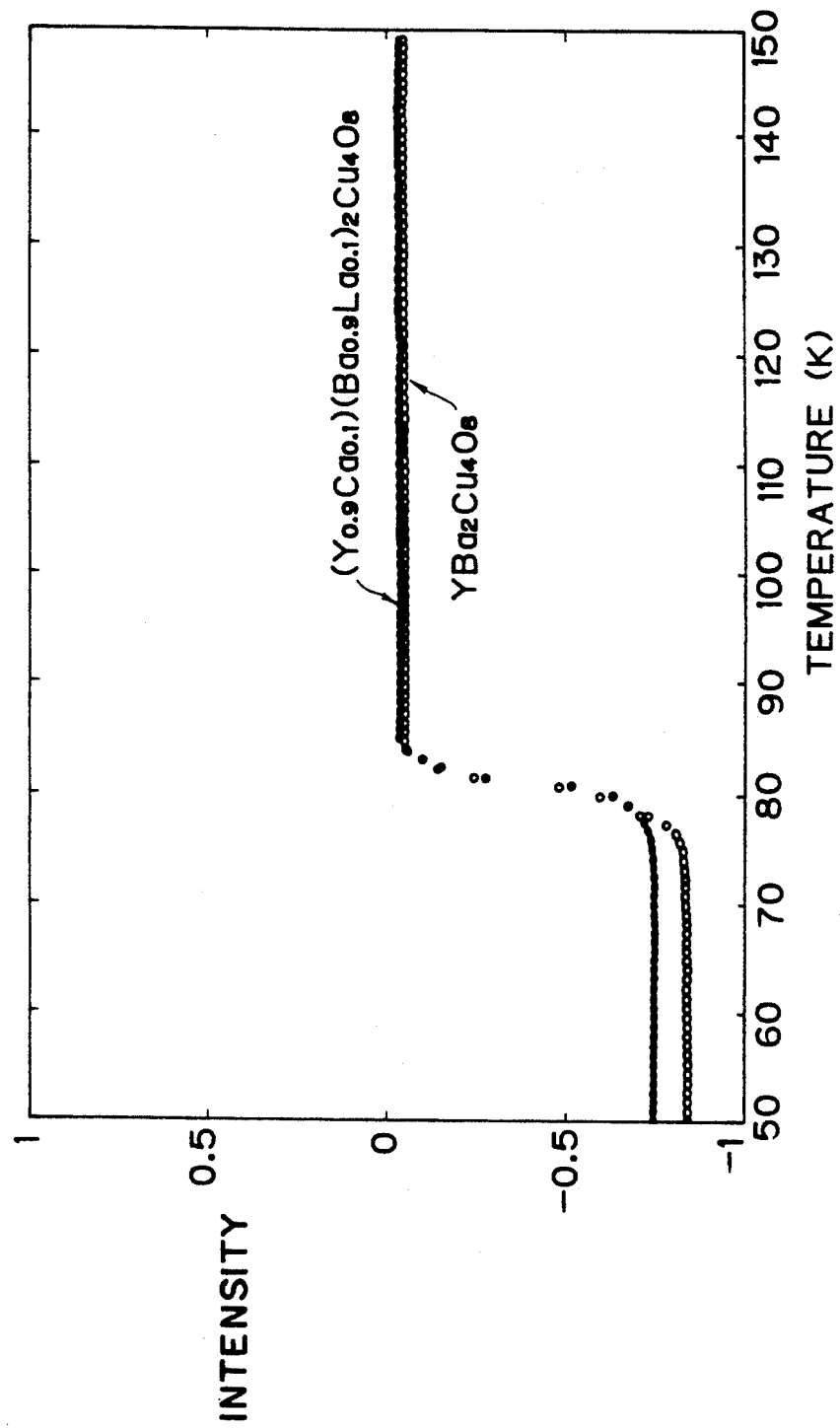
FIG. 15 is a graph showing the results of measurement of alternating-current magnetic susceptibility of $YBa_2Cu_4O_8$ and $(Y_{0.9}Ca_{0.1})(Ba_{0.9}La_{0.1})_2Cu_4O_8$ obtained in Example 6.
Figure 16:
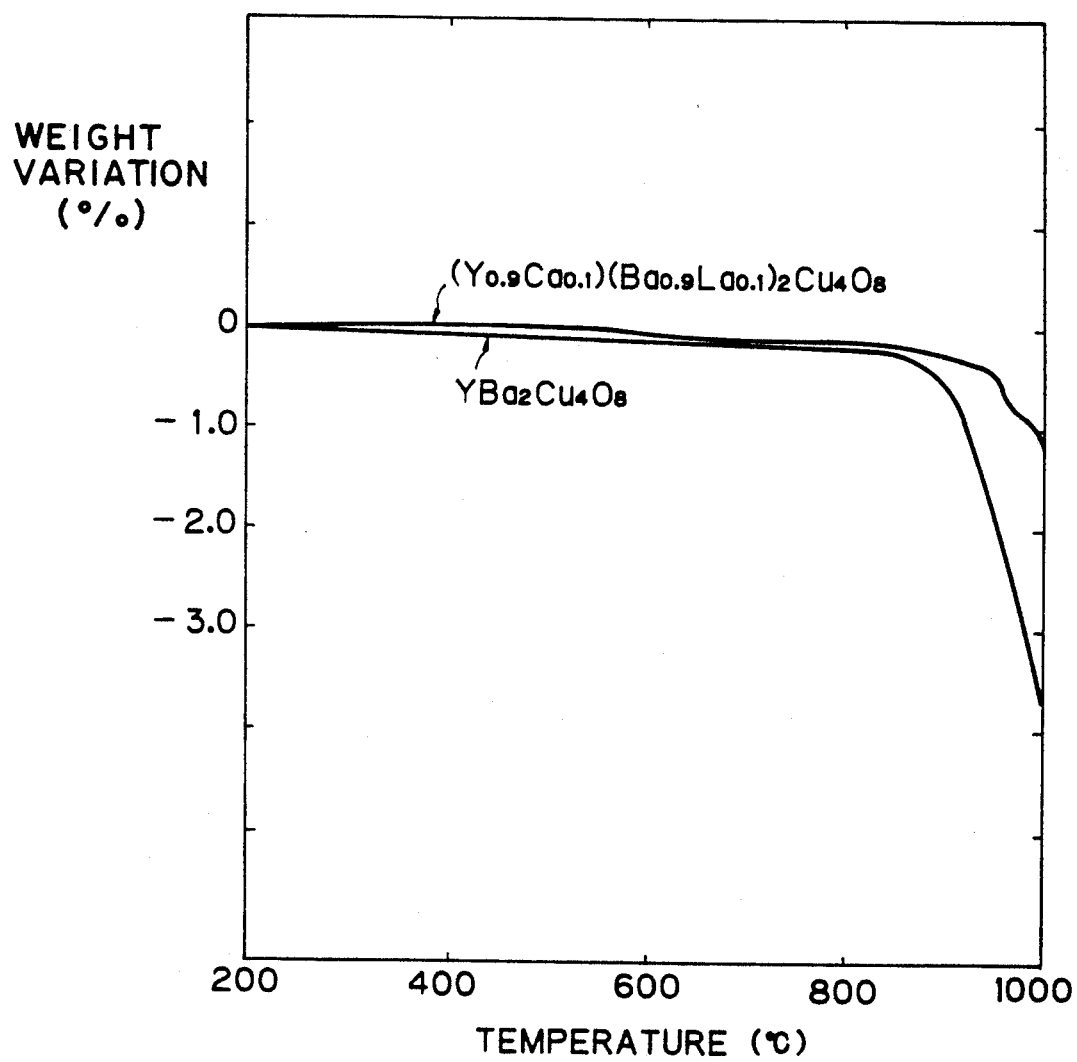
FIG. 16 is a graph showing the results of thermogravimetric analysis of $YBa_2Cu_4O_8$ and $(Y_{0.9}Ca_{0.1})(Ba_{0.9}La_{0.1})_2Cu_4O_8$ obtained in Example 6.

The x-ray diffraction pattern shown in FIG. 13 (x=0.1, y=0.1) indicates the presence of the $YBa_2Cu_4O_8$ crystal phase. The sintered samples with x of 0-0.15 and y of 0-0.1 were found to have a single layer superconducting phase. From the results summarized in Table 6 and in FIG. 14, it is seen that the addition of Ca and La in specific amounts is effective in reducing the amount of Ba while maintaining Tc above about 80K. The high Tc is also confirmed by the results shown in FIG. 15 indicating the occurrence of diamagnetism at a temperature of above about 80K. As seen from the results shown in FIG. 16, the sintered product with x=0.1 and y=0.1 is stable up to about 850° C., similar to $YBa_2Cu_4O_8$. This example also indicates that good results are obtainable even when $BaCO_3$ which is available at low costs is used as a source of Ba.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description, and all the changes which come within the meaning and range of equivalency of the claims are therefore intended to be embraced therein.

What is claimed is:

1. A superconductive material comprising a single crystal phase of the formula:

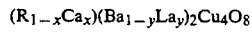

$(R_{1-x}Ca_x)(Ba_{1-y}La_y)_2Cu_4O_8$ wherein R is at least one element selected from the group consisting of for Y, Nd, Sm, Eu, Gd, Dy, Ho, Er, Tm, Yb and Lu, x is a number in the range of 0-0.3 and y is a number in the range of 0.01-0.3 with the proviso that y is not greater than 0.2 when x is not 0.

2. A superconductive material as claimed in claim 1, wherein x is a number in the range of 0.001-0.3 and R is at least one element selected from the group consisting of Y, Nd, Sm, Eu, Gd, Dy, Ho, Er and Tm.

3. A superconducting material as claimed in claim 1 and having the following formula:

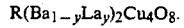

$R(Ba_{1-y}La_y)_2Cu_4O_8.$

* * * * *

UNITED STATES PATENT AND TRADEMARK OFFICE
CERTIFICATE OF CORRECTION

PATENT NO. : 5,169,830
DATED : December 8, 1992
INVENTOR(S) : WADA et al It is certified that error appears in the above-identified patent and that said Letters Patent is hereby corrected as shown below:

Col. 9, line 33, the last line of Table 6b, delete "$Cu_4O_8$" and insert -- $Cu_3O_7$ --.

Signed and Sealed this

Eighth Day of February, 1994

Attest:

BRUCE LEHMAN

Attesting Officer

Commissioner of Patents and Trademarks